US011283456B2

(12) United States Patent
Degani et al.

(10) Patent No.: US 11,283,456 B2
(45) Date of Patent: Mar. 22, 2022

(54) APPARATUSES FOR GENERATING AN OSCILLATION SIGNAL

(71) Applicant: Intel Corporation, Santa Clara, CA (US)

(72) Inventors: Ofir Degani, Nes-Ammin (IL); Igal Kushnir, Hod-Hasharon (IL); Elan Banin, Raanana (IL); Rotem Banin, Even-Yehuda (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/059,480

(22) PCT Filed: Aug. 5, 2019

(86) PCT No.: PCT/US2019/045048
§ 371 (c)(1),
(2) Date: Nov. 30, 2020

(87) PCT Pub. No.: WO2020/060680
PCT Pub. Date: Mar. 26, 2020

(65) Prior Publication Data
US 2021/0265999 A1    Aug. 26, 2021

(30) Foreign Application Priority Data

Sep. 21, 2018 (EP) .................................... 18195839

(51) Int. Cl.
*H03L 7/099* (2006.01)
*H03B 5/32* (2006.01)
(Continued)

(52) U.S. Cl.
CPC ............. *H03L 7/0992* (2013.01); *H03B 5/32* (2013.01); *H03L 7/0814* (2013.01); *H03L 7/091* (2013.01);
(Continued)

(58) Field of Classification Search
CPC ..... H03L 7/0992; H03L 7/0814; H03L 7/091; H03L 2207/50; H03L 7/081; H03L 7/23;
(Continued)

(56) References Cited

U.S. PATENT DOCUMENTS 4,831,339 A * 5/1989 Nemeth .................... H03J 7/16
331/2
5,757,239 A    5/1998 Gilmore
(Continued)

FOREIGN PATENT DOCUMENTS

| EP | 2782255 A1 | 9/2014 |
| JP | 2017-108282 A | 6/2017 |
| WO | 2005076480 A1 | 8/2005 |

*Primary Examiner* — Jean B Corrielus
(74) *Attorney, Agent, or Firm* — 2SPL Patent Attorneys PartG mbB; Kieran O'Leary (57) ABSTRACT

An apparatus for generating an oscillation signal is provided. The apparatus includes a first oscillator configured to generate a first reference oscillation signal, and a second oscillator configured to generate a second reference oscillation signal. A frequency accuracy of the first oscillator is higher than a frequency accuracy of the second oscillator. Further, an oscillator phase noise of the second oscillator is lower than an oscillator phase noise of the first oscillator. The apparatus further includes a processing circuit configured to generate a third reference oscillation signal based on the first reference oscillation signal and the second reference oscillation signal. Additionally, the apparatus includes a phase-locked loop configured to generate the oscillation signal based on the third reference oscillation signal. A frequency of the oscillation signal is a multiple of a frequency of the third reference oscillation signal.

25 Claims, 7 Drawing Sheets

(51) Int. Cl.
  *H03L 7/081* (2006.01)
  *H03L 7/091* (2006.01)
  *H04B 1/04* (2006.01)

(52) U.S. Cl.
  CPC ....... *H04B 1/04* (2013.01); *H04B 2001/0491* (2013.01)

(58) Field of Classification Search
  CPC .... H03L 7/07; H03B 5/32; H04B 1/04; H04B 2001/0491
  See application file for complete search history.

(56) References Cited

U.S. PATENT DOCUMENTS

| | | | | |
|---|---|---|---|---|
| 6,670,833 | B2* | 12/2003 | Kurd | H03L 7/0893 327/156 |
| 9,917,586 | B2* | 3/2018 | Chen | G01R 23/00 |
| 2002/0006171 | A1* | 1/2002 | Nielsen | H04N 5/455 375/316 |
| 2006/0014510 | A1 | 1/2006 | Yamamoto et al. | |
| 2008/0068236 | A1 | 3/2008 | Sheba et al. | |
| 2009/0081984 | A1 | 3/2009 | Gallus | |
| 2011/0204936 | A1 | 8/2011 | Brenndorfer | |
| 2012/0015610 | A1* | 1/2012 | Ruffieux | H03L 7/23 455/77 |
| 2013/0187720 | A1 | 7/2013 | Ishii | |
| 2015/0222276 | A1* | 8/2015 | Milijevic | H03L 7/0991 327/147 |
| 2016/0308491 | A1 | 10/2016 | Elgaard | |
| 2017/0201262 | A1* | 7/2017 | Bisanti | H03L 7/099 |
| 2020/0014371 | A1* | 1/2020 | Jansen | H03J 5/244 |

\* cited by examiner

Legend
100: Apparatus
101: Oscillation Signal
110: First Oscillator
111: First Reference Oscillation Signal
120: Second Oscillator
121: Second Reference Oscillation Signal
130: Processing Circuit
131: Third Reference Oscillation Signal
140: Phase-Locked Loop

Legend
800: Mobile Device
810: Transmitter
811: Apparatus for Generating an Oscillation Signal
812: Up-Conversion Circuit
820: Receiver
821: Apparatus for Generating an Oscillation Signal
822: Down-Conversion Circuit
830: Antenna Element

APPARATUSES FOR GENERATING AN OSCILLATION SIGNAL

FIELD

The present disclosure relates to oscillation signal generation. In particular, examples relate to apparatuses for generating an oscillation signal. Further examples relate to a transmitter, a receiver, a mobile device and a semiconductor die comprising at least one of the apparatuses for generating an oscillation signal.

BACKGROUND

Phase noise requirements for oscillation signals are getting tougher with each new communication standard. At the same time, low power consumption of the circuitry generating the oscillation signal is desired.

Hence, there may be a desire for an improved oscillation signal generation architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
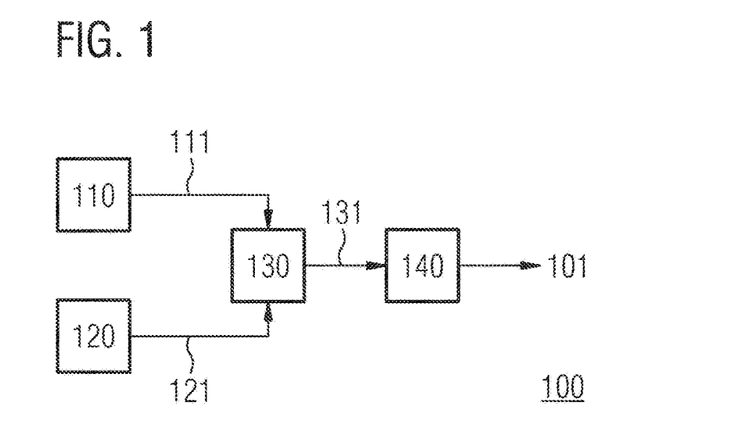
FIG. 1 illustrates a first example of an apparatus for generating an oscillation signal.

FIG. 1 illustrates an apparatus 100 for generating an oscillation signal 101. The apparatus 100 comprises a first oscillator 110 configured to generate a first reference oscillation signal 101, and second oscillator 120 configured to generate a second reference oscillation signal 121. A frequency accuracy of the first oscillator 110 is higher (better) than a frequency accuracy of the second oscillator 120. Further, an oscillator phase noise of the second oscillator 120 is lower than an oscillator phase noise of the first oscillator 110. For example, the frequency accuracy of the first oscillator 110 may be at least ten, hundred, thousand times higher than the frequency accuracy of the second oscillator 120. For enabling low oscillator phase noise, the second oscillator 120 may, e.g., comprises a high quality (high Q) resonator. Hence, the first oscillation signal 111 exhibits a high frequency accuracy (e.g. vs. Process, Voltage and Temperature, PVT, variations) while the second oscillation signal 121 exhibits low phase noise.

The apparatus 100 further comprises a processing circuit 130 configured to generate a third reference oscillation signal 131 based on the first reference oscillation signal 111 and the second reference oscillation signal 121. By combining the first reference oscillation signal 111 and the second reference oscillation signal 121, the processing circuit 130 may generate the third reference oscillation signal 131 at high frequency and high quality. In particular, the third reference oscillation signal 131 may exhibit a high frequency accuracy and a low level of phase noise. The frequency of the third reference oscillation signal 131 is higher than a frequency of the first reference oscillation signal 111. For example, the frequency of the third reference oscillation signal 131 may be at least 200, 400, 600, 800 or 1000 MHz.

Additionally, the apparatus 100 comprises Phase-Locked Loop (PLL) 140 configured to generate the oscillation signal 101 based on the third reference oscillation signal 131. The frequency of the oscillation signal 101 is a multiple of the frequency of the third reference oscillation signal 131. The third reference oscillation signal 131 may be understood as a high frequency, high quality reference for the PLL 140. The PLL 140 may be an Analog PLL (APLL) or a Digital PLL (DPLL). The frequency of the oscillation signal 101 may be an integer or a fractional multiple of the frequency of the third reference oscillation signal 131. In other words, the PLL 140 may be an integer PLL or a fractional PLL. For example, an integer-N DPLL (iDPLL) exhibiting a configurable output frequency may be used together with the configurable third reference oscillation signal 131. Due to its limited bandwidth, the PLL 140 may further allow to filter or reduce spurs present in the third reference oscillation signal 131. For example, a bandwidth of the PLL 140 may be less than 50, 40, 30, 20 or 10 MHz (i.e. less than ±25, ±20, ±15, ±10 or ±5 MHz).

The use of the PLL 140 together with the high frequency, high quality reference 131 may allow to generate the oscillation signal 101 with (very) low phase noise, low (reduced) spurs at low power consumption.

Figure 2:
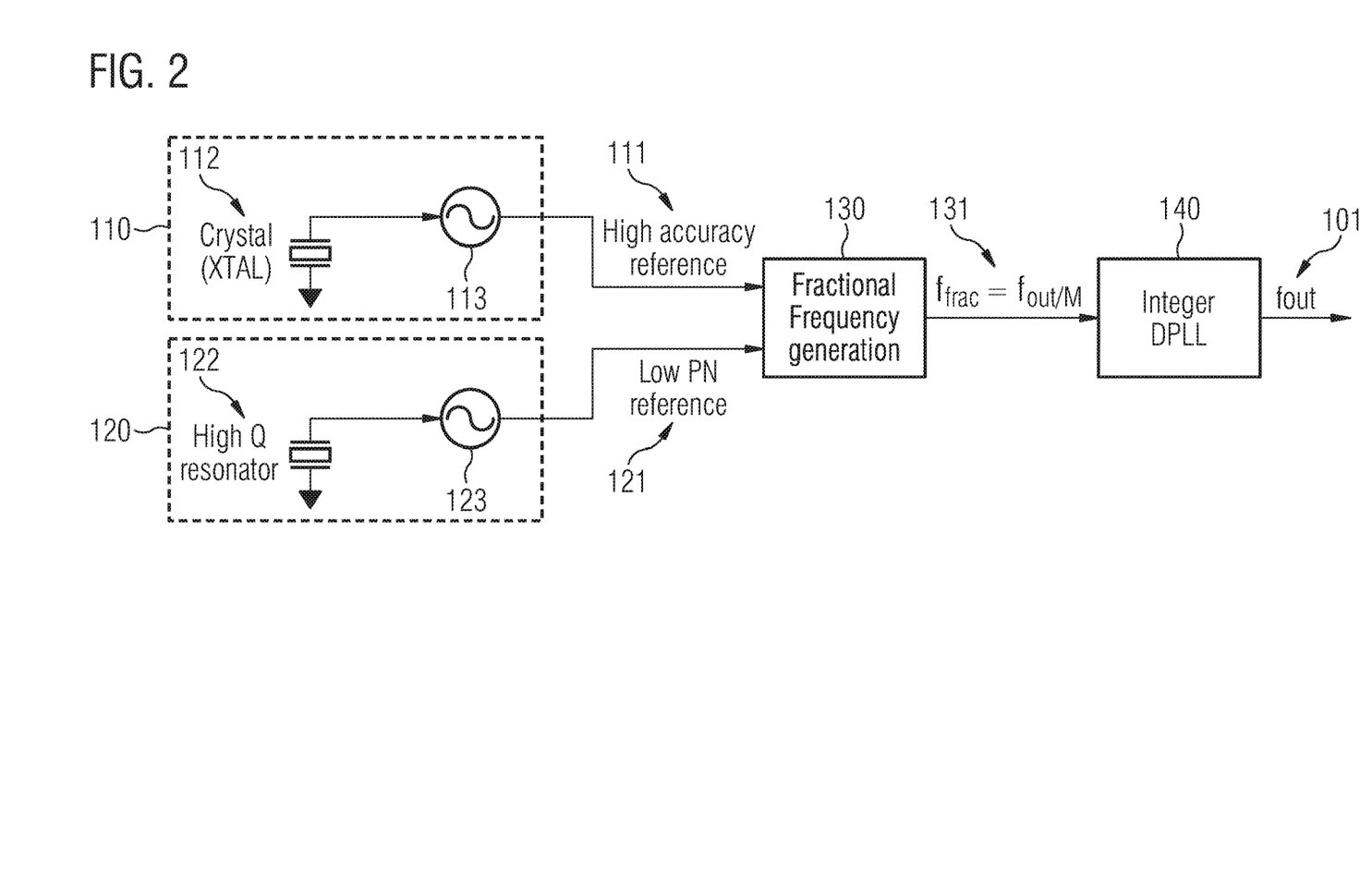
FIG. 2 illustrates a second example of an apparatus for generating an oscillation signal.

Another apparatus 200 for generating the oscillation signal 101 is illustrated in FIG. 2. In comparison to the apparatus 100 illustrated in FIG. 1, more details of the first oscillator 110 and the second oscillator 120 are illustrated.

The first oscillator 110 comprises a first resonator 112 and further oscillator circuitry 113 (e.g. load capacitors, buffers, voltage supply etc.). The first resonator 112 exhibits high frequency accuracy. For example, the first resonator 112 may be a crystal resonator as indicated in FIG. 2. A crystal resonator may, e.g., provide oscillation signals having their first harmonic at frequencies of less than 100 MHz. Alternatively, the first resonator 112 may be a MicroElectroMechanical System (MEMS) resonator, a piezoelectric resonator, an electrostatic resonator or a printed resonator. The first reference oscillation signal 111 of the first oscillator 110 serves as high frequency accuracy reference.

The second oscillator 120 comprises a second resonator 122 and further oscillator circuitry 123 (e.g. load capacitors, buffers, voltage supply etc.). The second resonator 122 as well as the other circuitry of the second oscillator provide low phase noise to the second reference oscillation signal 121. For example, the second resonator 122 may be a high Q resonator.

Using, e.g., a crystal resonator and a high Q resonator as references may allow to generate a high frequency third reference oscillation signal 131 (exhibiting e.g. a frequency of $f_{frac}$=1 GHz) that provides a high frequency accuracy (e.g. vs. temperature) as well as a desired low level of phase noise. This signal is feed as high frequency, high quality reference to the iDPLL 140.

The iDPLL 140 has a configurable output frequency so that the frequency of the oscillation signal is $f_{out}$=M·$f_{frac}$, wherein M is an adjustable integer. As described above, the specific use of the optimized iDPLL 140 together with the high frequency, high quality reference 131 may allow to achieve very low phase noise and reduced spurs in the oscillation signal 101. Further, the apparatus 200 may allow generation of the oscillation signal 101 at low power consumption.

Figure 3:
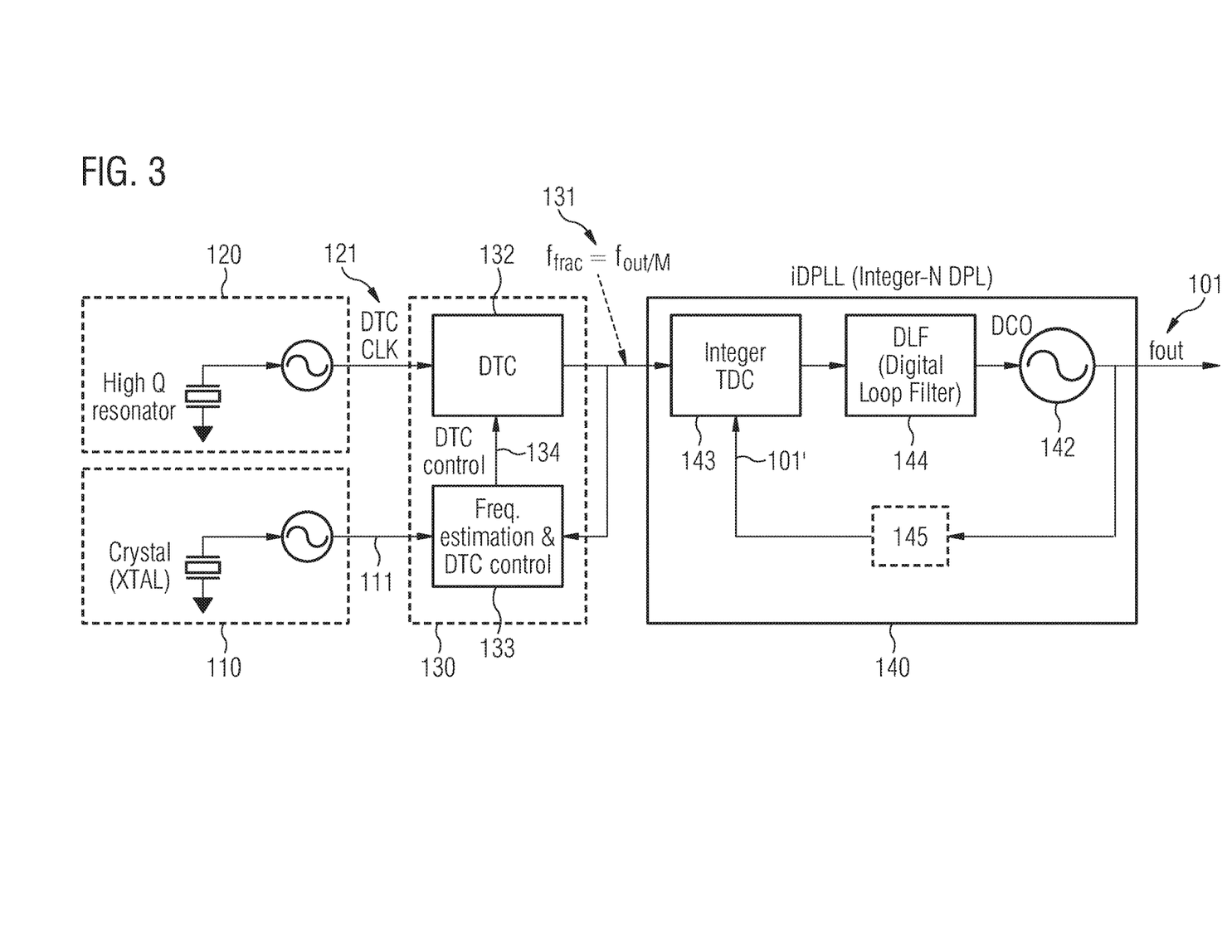
FIG. 3 illustrates a third example of an apparatus for generating an oscillation signal.

A further apparatus 300 for generating the oscillation signal 101 is illustrated in FIG. 3. Compared to the apparatus 200 illustrated in FIG. 3, the apparatus 300 illustrates further details of the processing circuit 130 and the PLL 140.

The apparatus 300 again uses two reference sources. The second oscillator 120 is used as a high Q reference source that generates the second reference oscillation signal 121 for clocking a phase shifter circuit 132 of the processing circuit 130. As indicated in FIG. 2, the phase shifter circuit 132 may, e.g., be a Digital-to-Time Converter (DTC) configured to receive the second reference oscillation signal 121 at a clock input terminal. The first oscillator 110 is used as an accurate but low quality reference that generate the first reference oscillation signal 111 for estimating the frequency of the third reference oscillation signal 131.

The phase shifter circuit 132 is configured to generate the third reference oscillation signal 131 based on the second reference oscillation signal 121 and a control word 134. A control circuit 133 of the processing circuit 130 is configured to determine a frequency shift of the third reference oscillation signal 131 with respect to the first reference oscillation signal 111, which exhibits high frequency accuracy. Further, the control circuit 133 is configured to generate the control word 134 based on the frequency shift. Due to the low phase noise of the second reference oscillation signal 121, the third reference oscillation signal exhibits very low jitter. Although the frequency of the clocking signal 121 for the phase shifter circuit 130 may vary due to PVT variations, the control of the phase shifter circuit 130 based on the first reference oscillation signal 111 exhibiting high frequency accuracy may allow to generate the third reference oscillation signal 131 with high frequency accuracy and low phase noise.

Due to the non-linearity of the phase shifter circuit 130 (e.g. a DTC), the third reference oscillation signal 131 may exhibit undesired spurs. For example, if used in a mobile communication system, the spurs in the third reference oscillation signal 131 may violate the regulations of a communication standard. Further, the spurs may be aggressors to sensitive circuitry and degrade the system performance. In order to mitigate ("spread down") the spurs, the control circuit 133 may, in some examples, be configured to dither the determined (measured) frequency shift based on a measured non-linearity of the phase shifter circuit 130 prior to generating the control word 134. In other words, the phase shifter circuit 130 may generate the control word 134 based on the dithered frequency shift. The above described dithering may allow to effectively mitigate (reduce, remove) spurs close to a center (carrier) frequency of the third reference oscillation signal 131.

In some examples, the apparatus 300 may additionally comprise a dithering circuit (not illustrated) coupled between the processing circuit 130 and the PLL 140. The dithering circuit is configured to dither the third reference oscillation signal 131 using sigma-delta spreading for further reducing the undesired spurs in the third reference oscillation signal 130. Dithering based on sigma-delta spreading may allow noise shaping in the third reference oscillation signal 131. For example, in-band noise of the third reference oscillation signal 131 may be reduced for the trade-off of increased out-of-band noise.

In some examples, the control circuit 133 may alternatively generate the control word 134 based on a frequency shift of the oscillation signal 101 with respect to the first reference oscillation signal 111. In other words, instead of the third reference oscillation signal 131, the oscillation signal 101 may be compared to the first reference oscillation signal 111.

In some examples, Direct Digital Synthesis (DSS) may be used for the phase shifter circuit 130 instead of a DTC. Then, the phase shifter circuit 130 may alternatively comprise a controlled oscillator (not illustrated) configured to generate a digital oscillation signal based on the second reference oscillation signal 121 and the control word 134. Further, the phase shifter circuit 130 may comprise a Digital-to-Analog Converter (DAC; not illustrated) configured to generate the (analog) third reference oscillation signal 131 based on the digital oscillation signal.

The third reference oscillation signal 131 is input to the PLL 140. As illustrated in FIG. 3, the PLL 140 may, e.g., be an iDPLL. The PLL 140 generates the desired high frequency for the oscillation signal 101 (e.g. around 30 or 40 GHz) and filters the spurs generated due to the non-linearity of the phase shifter circuit 130. The PLL 140 comprises a controlled oscillator 142 configured to generate the oscillation signal 101 based on a control signal. The control oscillator may, e.g., be a Digitally Controlled Oscillator (DCO) in a DPLL or a Voltage Controlled Oscillator (VCO) in an APLL.

A phase detector 143 of the PLL 140 is configured to generate the control signal based on a phase difference between the third reference oscillation signal 131 and the oscillation signal 101. The phase detector 143 may, e.g., be a Time-to-Digital-Converter (TDC) in a DPLL. Due to the high frequency reference 131 input to the PLL 140, a dynamic resolution of the phase detector 143 may be smaller than a dynamic resolution of the controlled oscillator 142. For example, the dynamic resolution of the phase detector 143 may be at least five, ten or hundred times smaller than the dynamic resolution of the controlled oscillator. The dynamic resolution of the phase detector may, e.g., be less than five picoseconds. For example, if the phase detector 143 is a TDC, the TDC may only comprise a few sampling sections for providing a dynamic resolution of a few picoseconds compared to conventional PLL architectures using hundreds of sampling sections in the TDC for substantially providing the same dynamic resolution as the controlled oscillator 142.

In order to implement the frequency multiplication, the PLL 140 may, e.g., further comprise a frequency divider 145 coupled between the controlled oscillator 142 and the phase detector 143. The frequency divider 145 is configured to frequency divide the oscillation signal 101, and to supply the frequency divided oscillation signal 101' to the phase detector 143 for comparison to the third reference oscillation signal 131.

Alternatively, if a TDC is used as phase detector 143, clock gating may be used instead of the frequency divider 145. The TDC converter comprises a plurality of sampling circuits configured to sample the oscillation signal 101 based on the third reference oscillation signal 131. In order to only sample the oscillation signal 101 at positions of signal edges in the third reference oscillation signal 131, the TDC is configured to clock gate the plurality of sampling circuits based on the third reference oscillation signal 131.

The PLL 140 further comprises a loop filter 144 for filtering the control signal for the controlled oscillator 142.

Figure 4:
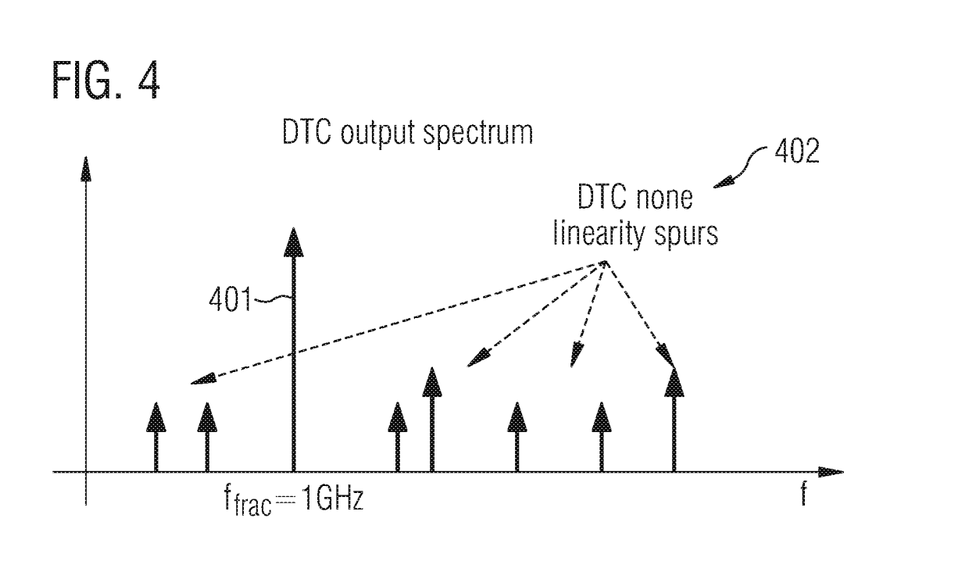
FIG. 4 illustrates an example of an output spectrum of a phase shifter circuit.
Figure 5:
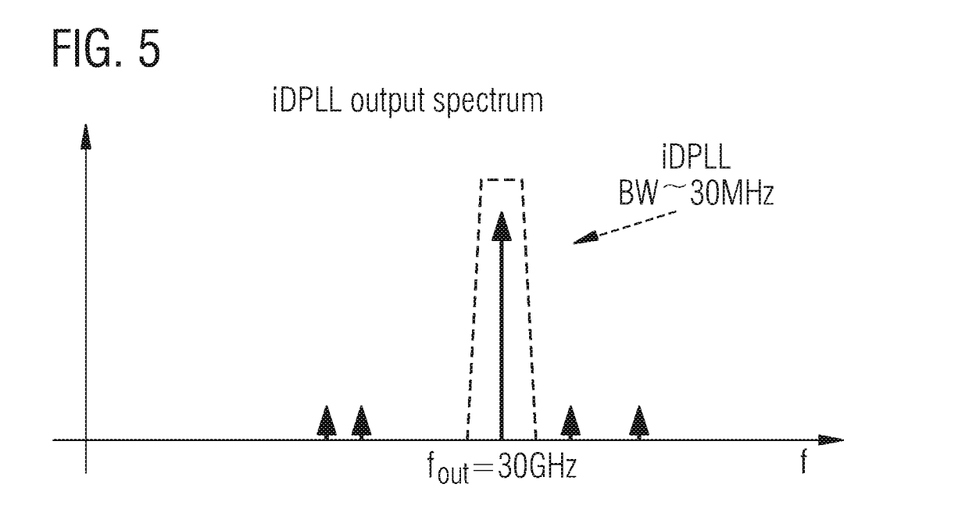
FIG. 5 illustrates an example of an output spectrum of a phase-locked loop.

As described above, the limited bandwidth of the PLL 140 (e.g. an iDPLL) may be used for mitigating spurs in the oscillation signal 101. A relatively small bandwidth (e.g. ±3 to ±15 MHz) of the PLL 140 may allow to filter all the spurs outside the PLL bandwidth. This effect is illustrated in FIGS. 4 and 5. FIG. 4 illustrates an exemplary spectrum of the third reference oscillation signal 131 as output by the phase shifter circuit 130. In the example of FIG. 4, it is assumed that the phase shifter circuit 130 is a DTC. It can be seen from FIG. 4 that apart from a desired signal component 401 at a carrier frequency of rac=1 GHz, the third reference oscillation signal 131 additionally comprises spurs 402 caused by the non-linearity of the DTC. FIG. 5 illustrates the spur mitigation effect of the PLL 140. Due to the limited bandwidth of the PLL 140 (30 MHz are assumed in the example of FIG. 5), all spurs outside the PLL bandwidth are filtered and, hence, mitigated. The PLL 140 may enable spur filtering and a low noise floor of the oscillation signal 101. Further, the PLL 140 multiplies the frequency of the input reference signal by a factor of 30 to the desired output frequency.

Further apparatuses for generating an oscillation signal that use two reference sources are described in the following with reference to FIGS. 6 and 7. In contrast to the examples described above, the examples of FIGS. 6 and 7 adjust the PLL internally instead of providing a dedicated high quality input signal for the PLL.

Figure 6:
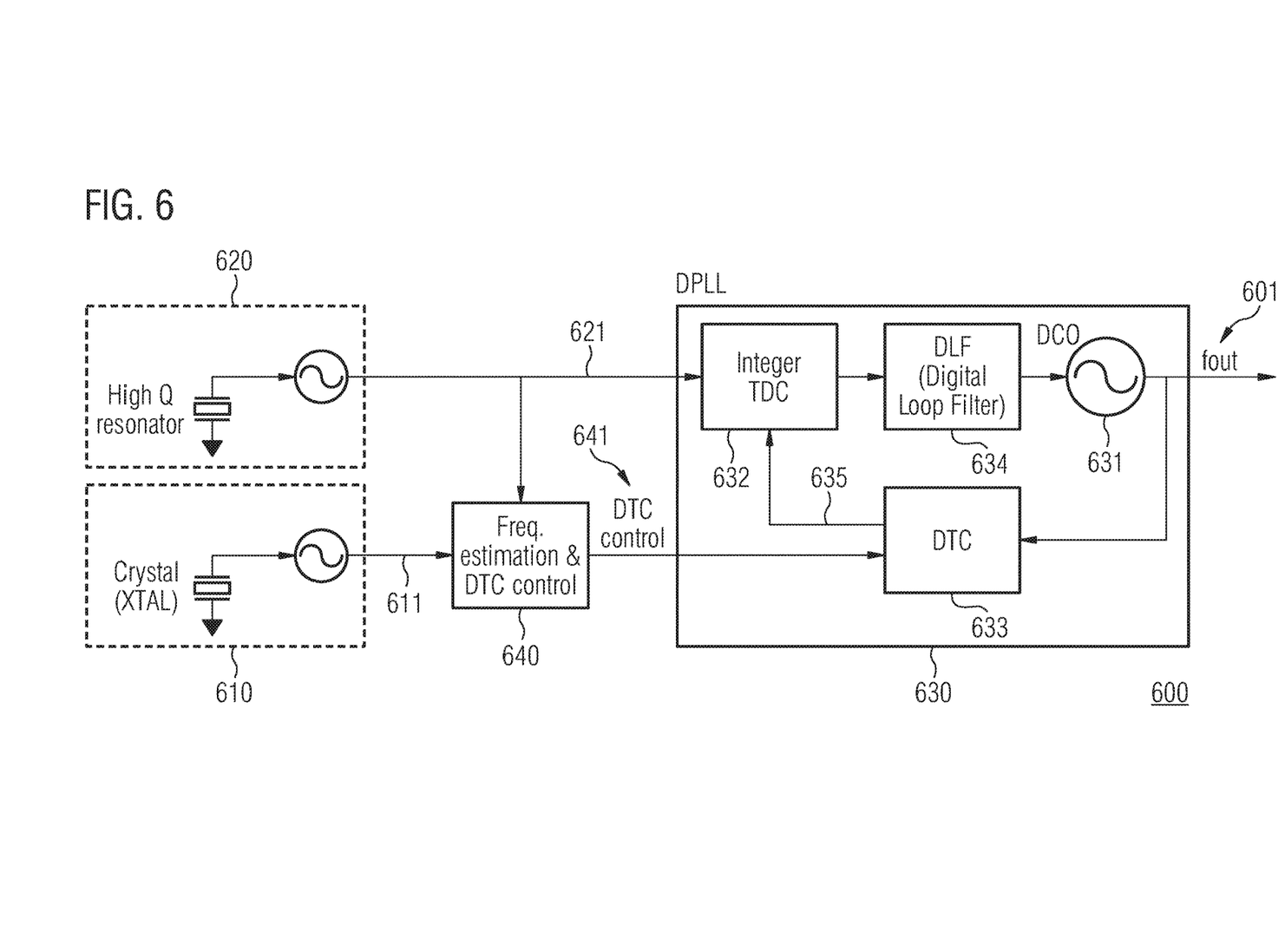
FIG. 6 illustrates a fourth example of an apparatus for generating an oscillation signal.
Figure 7:
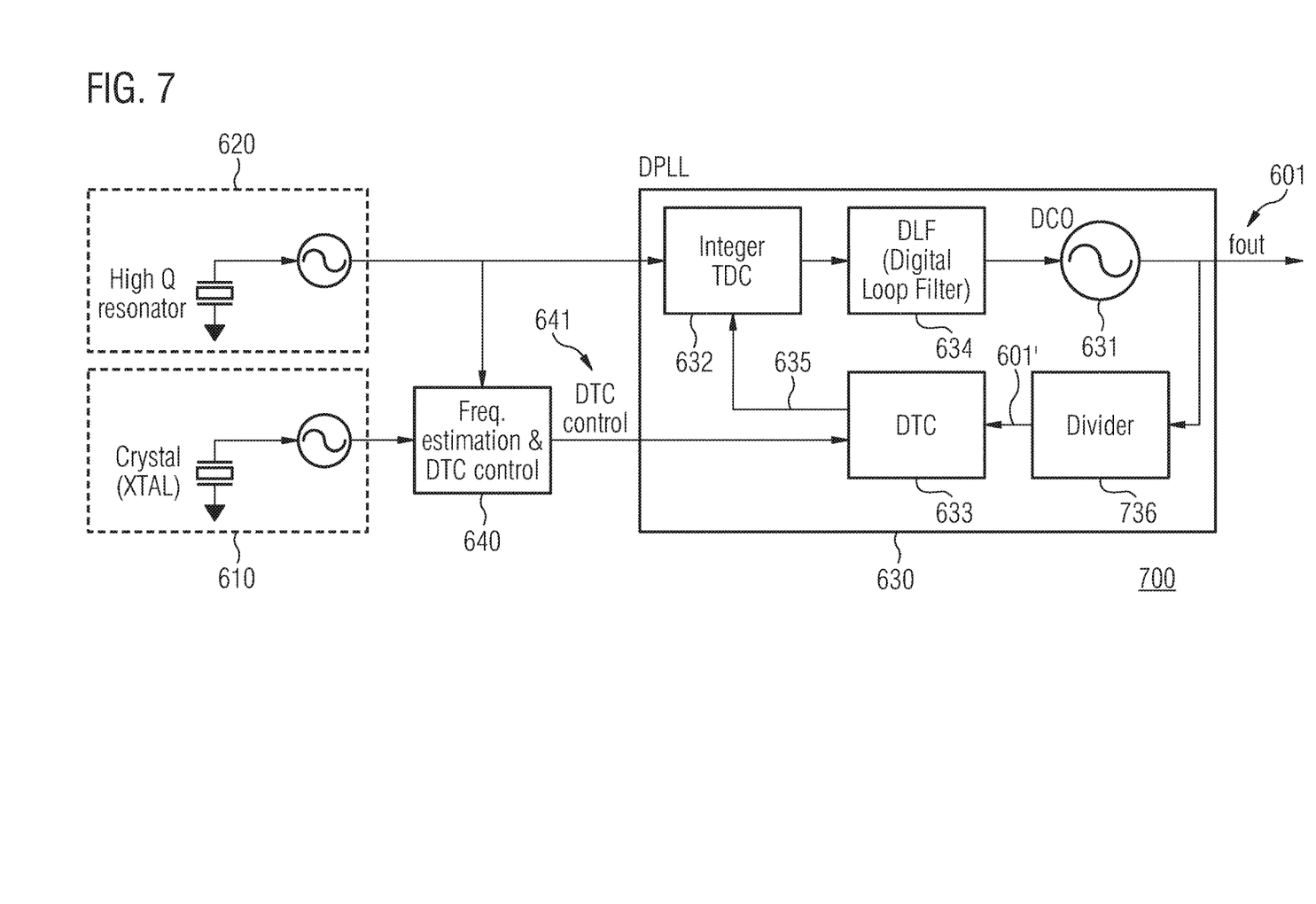
FIG. 7 illustrates a fifth example of an apparatus for generating an oscillation signal.

FIG. 6 illustrates an apparatus 600 for generating an oscillation signal 601. The apparatus comprises a first oscillator 610 configured to generate a first reference oscillation signal 611, and a second oscillator 620 configured to generate a second reference oscillation signal 621. A frequency accuracy of the first oscillator 610 is higher (better) than a frequency accuracy of the second oscillator 620. Further, an oscillator phase noise of the second oscillator 620 is lower than an oscillator phase noise of the first oscillator 610. The first and second oscillators 610 and 620 may be implemented like the first and second oscillators 110 and 120 described above. Similar to the above examples, the first oscillation signal 611 exhibits a high frequency accuracy (e.g. vs. PVT variations) while the second oscillation signal 621 exhibits low phase noise (low jitter). The second oscillation signal 632 is used as low phase noise input for a PLL 630 of the apparatus 600.

The PLL 630 comprises a controlled oscillator 631 configured to generate the oscillation signal 601 based on a control signal. A phase detector 632 (e.g. a TDC) of the PLL 630 is configured to generate the control signal based on a phase shift of the second reference oscillation signal 632 with respect to a third reference oscillation signal 635. The third reference oscillation signal 635 is based on the oscillation signal 601 and a frequency shift of the second reference oscillation 632 signal with respect to the first reference oscillation signal 631.

By generating the control signal for the controlled oscillator 631 based on not only the phase shift between the second oscillation signal 632 and the oscillation signal 631 but also the frequency shift of the second reference oscillation 632 signal with respect to the first reference oscillation signal 631, frequency deviations of the second reference oscillation signal 632 (vs. PVT variations) may be compensated by the PLL 630. Accordingly, also the apparatus 600 may allow to generate the oscillation signal 601 with (very) low phase noise, low (reduced) spurs at low power consumption. The frequency of the oscillation signal 601 is a multiple of the frequency of the second reference oscillation signal 621.

The apparatus 600 comprises a control circuit 640 for determining the frequency shift of the second reference oscillation signal 621 with respect to the first reference oscillation signal 611. The control circuit 640 is further configured to generate a control word 641 based on the frequency shift. The PLL 630 comprises a phase shifter circuit 633 (e.g. a DTC) configured to generate the third reference oscillation signal 635 based on the oscillation signal 601 and the control word 641.

Accordingly, the third reference oscillation signal 635 may exhibit a frequency $$f_{frac} = \frac{f_{out}}{M_{int} + K_{frac}} = f_{clk}, \quad (1)$$

with $f_{out}$ denoting the frequency of the oscillation signal 601, $f_{olk}$ denoting the actual frequency of the second reference oscillation signal 621, $M_{int}$ denoting the desired ratio of the frequency of the oscillation signal 601 to the ideal frequency of the second reference oscillation signal and $K_{frac}$ denoting a correction term for the deviation of the actual frequency of the second reference oscillation signal 621 from the ideal frequency of the second reference oscillation signal 621 (indicated by the frequency shift of the second reference oscillation signal 621 to the first reference oscillation signal 611).

In other words, frequency deviations of the second reference oscillation signal 621 may be compensated by varying the frequency of the reference signal used by the PLL 630's phase detector for determining the control signal for the controlled oscillator 631.

Similarly, to what is described above, the control circuit 640 may be further configured to dither the determined (measured) frequency shift based on a measured non-linearity of the phase shifter circuit 633 prior to generating the second control word 641 in order to compensate for spurs generated by the phase shifter circuit 633. Further, the limited bandwidth of the PLL 630 (e.g. less than 50, 40, 30, 20 or 10 MHz) effectively removes spurs outside the PLL bandwidth from the oscillation signal 601.

Again, clock gating may be used for multiplying the frequency of the oscillation signal compared to the second reference oscillation signal if a TDC is used as phase detector 631. That is, the TDC is configured to clock gate the plurality of sampling circuits based on the second reference oscillation signal 621 so that the sampling circuits sample the third reference oscillation signal 635 only at positions of signal edges in the second reference oscillation signal 621.

Like in the above examples, the dynamic resolution of the phase detector 632 may be smaller than the dynamic resolution of the controlled oscillator 631. For example, the dynamic resolution of the phase detector 632 may be at least five, ten or hundred times smaller than the dynamic resolution of the controlled oscillator 631. The dynamic resolution of the phase detector 632 may, e.g., be less than five picoseconds.

The apparatus 600 may, e.g., be used for generating a sub millimeter wave oscillation signal 601. An apparatus 700 that may be used for generating millimeter wave oscillation signals is illustrated in FIG. 7. Compared to the apparatus 600 illustrated in FIG. 6, the PLL 630 of the apparatus 700 additionally comprises a frequency divider 736 configured to frequency divide the oscillation signal 601. The frequency divider 736 is further configured to supply the frequency divided oscillation signal 601 to a clock input terminal of the phase shifter circuit 633 so that the phase shifter circuit 633 generates the third reference oscillation signal 635 based on the frequency divided oscillation signal 601. Accordingly, higher frequencies for the oscillation signal 601 may be reached.

Apparatuses for generating an oscillation signal according to the proposed architecture may allow to generation the oscillation signal with low phase noise and low spur level at low power consumption.

The resonators of the reference oscillators may be on-chip or off-chip. Therefore, examples of the present disclosure further relate to a semiconductor die comprising an apparatus for generating an oscillation signal according to the proposed architecture.

Figure 8:
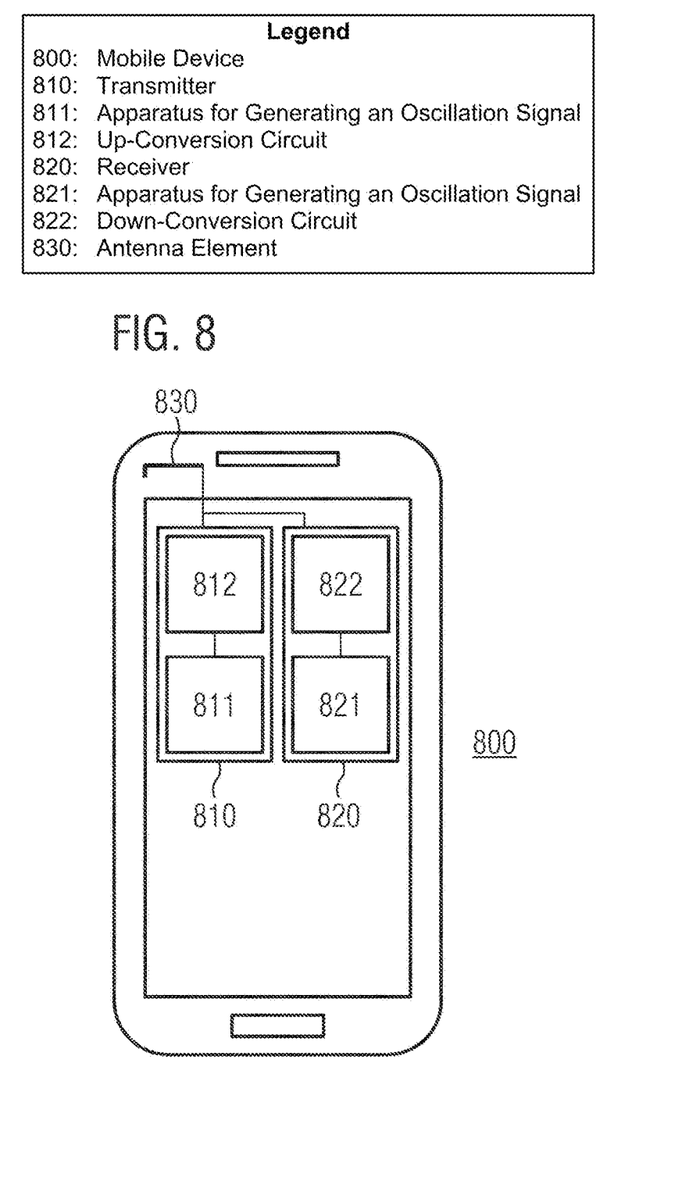
FIG. 8 illustrates an example of a mobile device comprising an apparatus for generating an oscillation signal.

An example of an implementation using oscillation signal generation according to one or more aspects of the proposed technique or one or more examples described above is illustrated in FIG. 8. FIG. 8 schematically illustrates an example of a mobile device 800 (e.g. mobile phone, smartphone, tablet-computer, or laptop) comprising at least one of a transmitter 810 and receiver 820. In some examples, the transmitter 810 and the receiver 820 may be part of a transceiver.

The transmitter 810 comprises an apparatus 811 for generating an oscillation signal according to one or more aspects of the proposed technique. Further, the transmitter 810 comprises an up-conversion circuit 812 configured to generate a radio frequency transmit signal based on a baseband transmit signal and the oscillation signal provided by the apparatus 811.

The receiver 820 comprises an apparatus 821 for generating an oscillation signal according to one or more aspects of the proposed technique. Further, the receiver 820 comprises a down-conversion circuit 822 configured to generate a baseband receive signal based on a radio frequency receive signal and the oscillation signal provided by the apparatus 821.

A frequency of the oscillation signal may, e.g., be more than 4 GHz or more than 25 GHz.

The transmitter 810 and/or the receiver 820 is/are coupled to at least one antenna element 830 for radiating the radio frequency transmit signal to the environment and/or for receiving the radio frequency receive signal from the environment.

The mobile device 800 may comprise further elements such as, e.g., an application processor, a baseband processor, memory, an audio driver, a camera driver, a touch screen, a display driver, sensors, removable memory, a power management integrated circuit or a smart battery.

To this end, a mobile device enabling high frequency and high quality oscillation signal generation may be provided. As described above, oscillation signals exhibiting low phase noise and reduced spurs may be provided at low power consumption for up- and/or down-conversion of communication signals. Accordingly, transmit and/or receive signal processing with an improved Error Vector Magnitude (EVM), lower power consumption and reduced spurs may be achieved.

The above wireless communication circuits using oscillation signal generation according to the proposed technique or one or more of the examples described above may be configured to operate according to one of the $3^{rd}$ Generation Partnership Project (3GPP)-standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples as described herein may be summarized as follows:

Example 1 is an apparatus for generating an oscillation signal, comprising: a first oscillator configured to generate a first reference oscillation signal; a second oscillator configured to generate a second reference oscillation signal, wherein a frequency accuracy of the first oscillator is higher than a frequency accuracy of the second oscillator, and wherein an oscillator phase noise of the second oscillator is lower than an oscillator phase noise of the first oscillator; a processing circuit configured to generate a third reference oscillation signal based on the first reference oscillation signal and the second reference oscillation signal; and a phase-locked loop configured to generate the oscillation signal based on the third reference oscillation signal, wherein a frequency of the oscillation signal is a multiple of a frequency of the third reference oscillation signal.

Example 2 is the apparatus of example 1, wherein the frequency accuracy of the first oscillator is at least ten times higher than the frequency accuracy of the second oscillator.

Example 3 is the apparatus of example 1 or example 2, wherein the second oscillator comprises a high quality resonator.

Example 4 is the apparatus of any of examples 1 to 3, wherein the frequency of the third reference oscillation signal is higher than a frequency of the first reference oscillation signal.

Example 5 is the apparatus of any of examples 1 to 4, wherein the frequency of the third reference oscillation signal is at least 200 MHz.

Example 6 is the apparatus of any of examples 1 to 5, wherein the first oscillator comprises one of a crystal resonator, a microelectromechanical system resonator, a piezoelectric resonator, an electrostatic resonator, and a printed resonator.

Example 7 is the apparatus of any of examples 1 to 6, wherein the processing circuit comprises: a phase shifter circuit configured to generate the third reference oscillation signal based on the second reference oscillation signal and a control word; and a control circuit configured to determine a frequency shift of the third reference oscillation signal with respect to the first reference oscillation signal, and to generate the control word based on the frequency shift.

Example 8 is the apparatus of any of examples 1 to 6, wherein the processing circuit comprises: a phase shifter circuit configured to generate the third reference oscillation signal based on the second reference oscillation signal and a control word; and a control circuit configured to determine a frequency shift of the oscillation signal with respect to the first reference oscillation signal, and to generate the control word based on the frequency shift.

Example 9 is the apparatus of example 7 or example 8, wherein the phase shifter circuit is a digital-to-time converter configured to receive the second reference oscillation signal at a clock input terminal.

Example 10 is the apparatus of example 7 or example 8, wherein the phase shifter circuit comprises: a controlled oscillator configured to generate a digital oscillation signal based on the second reference oscillation signal and the control word; and a digital-to-analog converter configured to generate the third reference oscillation signal based on the digital oscillation signal.

Example 11 is the apparatus of any of examples 1 to 10, wherein the control circuit is further configured to dither the frequency shift based on a measured non-linearity of the phase shifter circuit prior to generating the control word.

Example 12 is the apparatus of any of examples 1 to 11, further comprising a dithering circuit coupled between the processing circuit and the phase-locked loop, wherein the dithering circuit is configured to dither the third reference oscillation signal using sigma-delta spreading.

Example 13 is the apparatus of any of examples 1 to 12, wherein the phase-locked loop comprises: a controlled oscillator configured to generate the oscillation signal based on a control signal; and a phase detector configured to generate the control signal based on a phase difference between the third reference oscillation signal and the oscillation signal, wherein a dynamic resolution of the phase detector is smaller than a dynamic resolution of the controlled oscillator.

Example 14 is the apparatus of example 13, wherein the dynamic resolution of the phase detector is less than five picoseconds.

Example 15 is the apparatus of example 13 or example 14, wherein the dynamic resolution of the phase detector is at least ten times smaller than the dynamic resolution of the controlled oscillator.

Example 16 is the apparatus of any of examples 13 to 15, wherein the phase-locked loop further comprises a frequency divider configured to frequency divide the oscillation signal, and to supply the frequency divided oscillation signal to the phase detector for comparison to the third reference oscillation signal.

Example 17 is the apparatus of any of examples 13 to 16, wherein the phase detector is a time-to-digital-converter.

Example 18 is the apparatus of example 17, wherein the time-to-digital-converter comprises a plurality of sampling circuits configured to sample the oscillation signal based on the third reference oscillation signal, and wherein time-to-digital-converter is configured to clock gate the plurality of sampling circuits based on the third reference oscillation signal.

Example 19 is the apparatus of any of example 13 to 18, wherein a bandwidth of the phase-locked loop is less than 50 MHz.

Example 20 is an apparatus for generating an oscillation signal, comprising: a first oscillator configured to generate a first reference oscillation signal; a second oscillator configured to generate a second reference oscillation signal, wherein a frequency accuracy of the first oscillator is higher than a frequency accuracy of the second oscillator, and wherein an oscillator phase noise of the second oscillator is lower than an oscillator phase noise of the first oscillator; and a phase-locked loop, comprising: a controlled oscillator configured to generate the oscillation signal based on a control signal, wherein a frequency of the oscillation signal is a multiple of a frequency of the second reference oscillation signal; and a phase detector configured to generate the control signal based on a phase shift of the second reference oscillation signal with respect to a third reference oscillation signal, wherein the third reference oscillation signal is based on the oscillation signal and a frequency shift of the second reference oscillation signal with respect to the first reference oscillation signal.

Example 21 is the apparatus of example 20, wherein the apparatus further comprises a control circuit configured to determine the frequency shift of the second reference oscillation signal with respect to the first reference oscillation signal, wherein the control circuit is further configured to generate a control word based on the frequency shift, and wherein the phase-locked loop further comprises a phase shifter circuit configured to generate the third reference oscillation signal based on the oscillation signal and the control word.

Example 22 is the apparatus of example 21, wherein the phase-locked loop further comprises a frequency divider configured to frequency divide the oscillation signal, and to supply the frequency divided oscillation signal to the phase shifter circuit.

Example 23 is the apparatus of example 21 or example 22, wherein the control circuit control circuit is further configured to dither the frequency shift based on a measured non-linearity of the phase shifter circuit prior to generating the control word.

Example 24 is the apparatus of any of examples 20 to 23, wherein the frequency accuracy of the first oscillator is at least ten times higher than the frequency accuracy of the second oscillator.

Example 25 is the apparatus of any of examples 20 to 24, wherein the second oscillator comprises a high quality resonator.

Example 26 is the apparatus of any of examples 20 to 25, wherein the first oscillator comprises one of a crystal resonator, a microelectromechanical system resonator, a piezoelectric resonator, an electrostatic resonator, and a printed resonator.

Example 27 is the apparatus of any of examples 20 to 26, wherein the dynamic resolution of the phase detector is less than 5 picoseconds.

Example 28 is the apparatus of any of examples 20 to 27, wherein the dynamic resolution of the phase detector is at least ten times smaller than the dynamic resolution of the controlled oscillator.

Example 29 is the apparatus of any of examples 20 to 28, wherein the phase detector is a time-to-digital-converter.

Example 30 is the apparatus of any of examples 20 to 29, wherein the phase shifter circuit is a digital-to-time converter.

Example 31 is the apparatus of any of examples 20 to 30, wherein a bandwidth of the phase-locked loop is less than 50 MHz.

Example 32 is a transmitter, comprising: an apparatus for generating an oscillation signal according to any of examples 1 to 31, and an up-conversion circuit configured to generate a radio frequency transmit signal based on a baseband transmit signal and the oscillation signal.

Example 33 is the transmitter of example 32, wherein a frequency of the oscillation signal is more than 4 GHz or more than 25 GHz.

Example 34 is a receiver, comprising: an apparatus for generating an oscillation signal according to any of examples 1 to 31, and a down-conversion circuit configured to generate a baseband receive signal based on a radio frequency receive signal and the oscillation signal.

Example 35 is the receiver of example 34, wherein a frequency of the oscillation signal is more than 4 GHz or more than 25 GHz.

Example 36 is a mobile device comprising a transmitter according to any of examples 32 and 33 and/or a receiver according to any of examples 34 and 35.

Example 37 is the mobile device of example 36, further comprising at least one antenna element coupled to the transmitter and/or the receiver.

Example 38 is a semiconductor die comprising an apparatus for generating an oscillation signal according to any of examples 1 to 31.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for generating an oscillation signal, comprising:
   a first oscillator configured to generate a first reference oscillation signal;
   a second oscillator configured to generate a second reference oscillation signal, wherein a frequency accuracy of the first oscillator is higher than a frequency accuracy of the second oscillator, and wherein an oscillator phase noise of the second oscillator is lower than an oscillator phase noise of the first oscillator;
   a processing circuit configured to generate a third reference oscillation signal based on the first reference oscillation signal and the second reference oscillation signal; and a phase-locked loop configured to generate the oscillation signal based on the third reference oscillation signal, wherein a frequency of the oscillation signal is a multiple of a frequency of the third reference oscillation signal.

2. The apparatus of claim 1, wherein the frequency accuracy of the first oscillator is at least ten times higher than the frequency accuracy of the second oscillator.

3. The apparatus of claim 1, wherein the second oscillator comprises a high quality resonator.

4. The apparatus of claim 1, wherein the frequency of the third reference oscillation signal is higher than a frequency of the first reference oscillation signal.

5. The apparatus of claim 1, wherein the frequency of the third reference oscillation signal is at least 200 MHz.

6. The apparatus of claim 1, wherein the first oscillator comprises one of a crystal resonator, a microelectromechanical system resonator, a piezoelectric resonator, an electrostatic resonator, and a printed resonator.

7. The apparatus of claim 1, wherein the processing circuit comprises:
a phase shifter circuit configured to generate the third reference oscillation signal based on the second reference oscillation signal and a control word; and
a control circuit configured to determine a frequency shift of the third reference oscillation signal with respect to the first reference oscillation signal, and to generate the control word based on the frequency shift.

8. The apparatus of claim 1, wherein the processing circuit comprises:
a phase shifter circuit configured to generate the third reference oscillation signal based on the second reference oscillation signal and a control word; and
a control circuit configured to determine a frequency shift of the oscillation signal with respect to the first reference oscillation signal, and to generate the control word based on the frequency shift.

9. The apparatus of claim 7, wherein the phase shifter circuit is a digital-to-time converter configured to receive the second reference oscillation signal at a clock input terminal.

10. The apparatus of claim 7, wherein the phase shifter circuit comprises:
a controlled oscillator configured to generate a digital oscillation signal based on the second reference oscillation signal and the control word; and
a digital-to-analog converter configured to generate the third reference oscillation signal based on the digital oscillation signal.

11. The apparatus of claim 7, wherein the control circuit is further configured to dither the frequency shift based on a measured non-linearity of the phase shifter circuit prior to generating the control word.

12. The apparatus of claim 1, further comprising a dithering circuit coupled between the processing circuit and the phase-locked loop, wherein the dithering circuit is configured to dither the third reference oscillation signal using sigma-delta spreading.

13. The apparatus of claim 1, wherein the phase-locked loop comprises:
a controlled oscillator configured to generate the oscillation signal based on a control signal; and
a phase detector configured to generate the control signal based on a phase difference between the third reference oscillation signal and the oscillation signal, wherein a dynamic resolution of the phase detector is smaller than a dynamic resolution of the controlled oscillator.

14. The apparatus of claim 13, wherein the dynamic resolution of the phase detector is less than five picoseconds.

15. The apparatus of claim 13, wherein the dynamic resolution of the phase detector is at least ten times smaller than the dynamic resolution of the controlled oscillator.

16. The apparatus of claim 13, wherein the phase-locked loop further comprises a frequency divider configured to frequency divide the oscillation signal, and to supply the frequency divided oscillation signal to the phase detector for comparison to the third reference oscillation signal.

17. The apparatus of claim 13, wherein the phase detector is a time-to-digital-converter.

18. The apparatus of claim 17, wherein the time-to-digital-converter comprises a plurality of sampling circuits configured to sample the oscillation signal based on the third reference oscillation signal, and wherein time-to-digital-converter is configured to clock gate the plurality of sampling circuits based on the third reference oscillation signal.

19. The apparatus of claim 13, wherein a bandwidth of the phase-locked loop is less than 50 MHz.

20. A transmitter, comprising:
the apparatus of claim 1 for generating the oscillation signal, and
an up-conversion circuit configured to generate a radio frequency transmit signal based on a baseband transmit signal and the oscillation signal.

21. The transmitter of claim 20, wherein a frequency of the oscillation signal is more than 4 GHz or more than 25 GHz.

22. A receiver, comprising:
the apparatus of claim 1 for generating the oscillation signal, and
a down-conversion circuit configured to generate a baseband receive signal based on a radio frequency receive signal and the oscillation signal.

23. The receiver of claim 22, wherein a frequency of the oscillation signal is more than 4 GHz or more than 25 GHz.

24. A mobile device comprising the transmitter of claim 20.

25. A semiconductor die comprising the apparatus of claim 1 for generating the oscillation signal.

* * * * *